(12) United States Patent
Lim

(10) Patent No.: US 8,796,799 B2
(45) Date of Patent: Aug. 5, 2014

(54) IMAGE SENSOR AND METHOD FOR FABRICATING THE SAME

(75) Inventor: Youn-Sub Lim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 13/351,488

(22) Filed: Jan. 17, 2012

(65) Prior Publication Data

US 2012/0273907 A1      Nov. 1, 2012

(30) Foreign Application Priority Data

Apr. 27, 2011   (KR) .................... 10-2011-0039697

(51) Int. Cl.
*H01L 31/0232*   (2014.01)
*H01L 21/00*   (2006.01)

(52) U.S. Cl.
USPC .............. 257/432; 257/E27.13; 257/E33.127; 438/69

(58) Field of Classification Search
USPC .......................................... 257/432; 438/69
See application file for complete search history.

(56) References Cited

U.S. PATENT DOCUMENTS

| 2006/0115230 | A1* | 6/2006 | Komoguchi et al. | .......... 385/146 |
| 2006/0138577 | A1* | 6/2006 | Hashimoto | ................... 257/432 |
| 2007/0040102 | A1* | 2/2007 | Mouli | ......................... 250/214.1 |
| 2010/0178018 | A1* | 7/2010 | Augusto | ...................... 385/131 |

FOREIGN PATENT DOCUMENTS

| JP | 2008-091744 | 4/2008 |
| KR | 1020030002902 | 1/2003 |
| KR | 100749263 | 8/2007 |
| KR | 1020090082122 | 7/2009 |

OTHER PUBLICATIONS

Office Action issued by the Korean Intellectual Property Office on Jul. 6, 2012.
Notice of Allowance issued by the Korean Intellectual Property Office on Jan. 28, 2013.

* cited by examiner

*Primary Examiner* — Matthew Landau
*Assistant Examiner* — Igwe U Anya
(74) *Attorney, Agent, or Firm* — IP & T Group LLP

(57) ABSTRACT

An image sensor includes: a substrate having a plurality of unit pixel region; a light receiving element formed in the substrate at the unit pixel region; an interlayer dielectric layer formed over the substrate; a lightguide formed in the interlayer dielectric layer for the light receiving element; a light focusing pattern formed over the interlayer dielectric layer at the pixel region; a planarization layer formed over the substrate and covering the light focusing pattern; and a lens formed over the planarization layer at the pixel region.

10 Claims, 8 Drawing Sheets

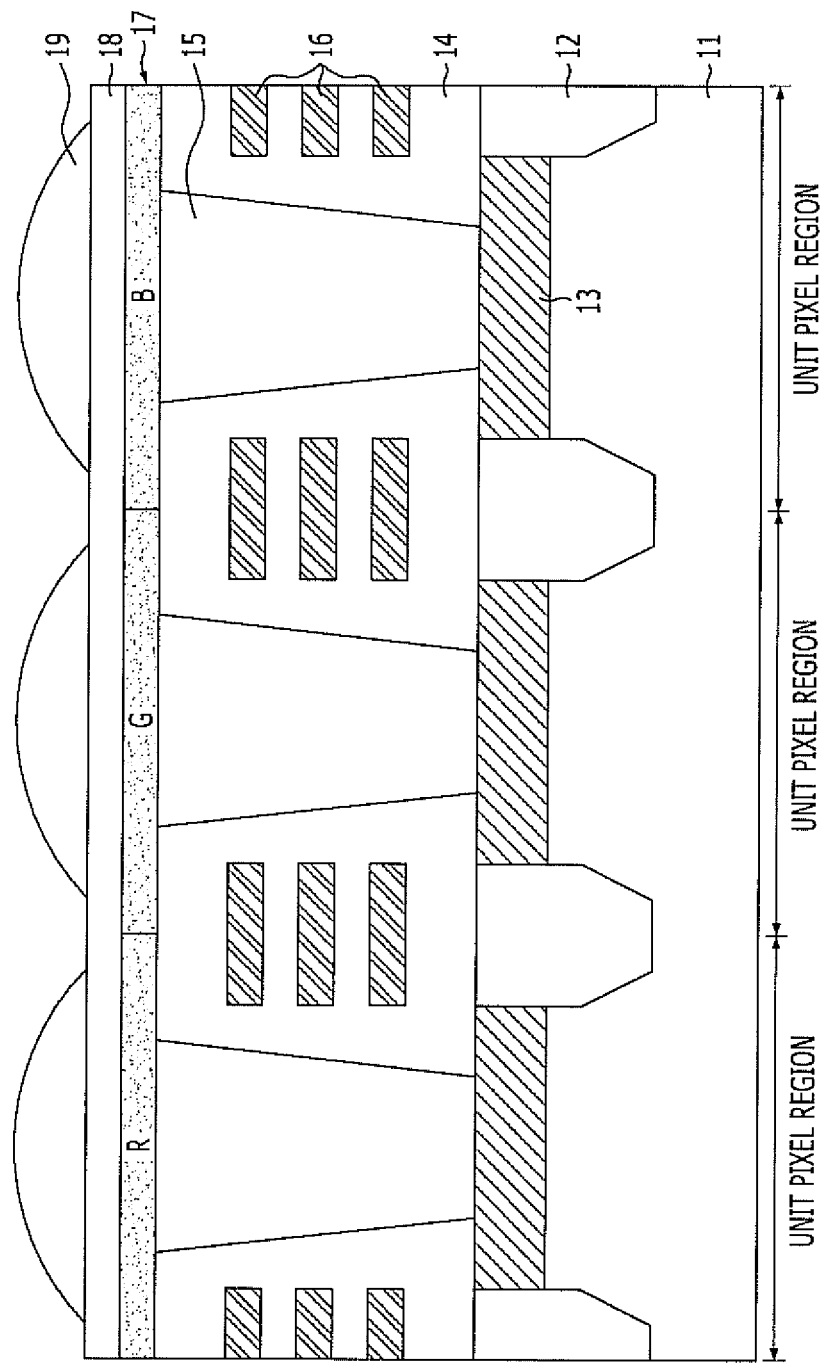

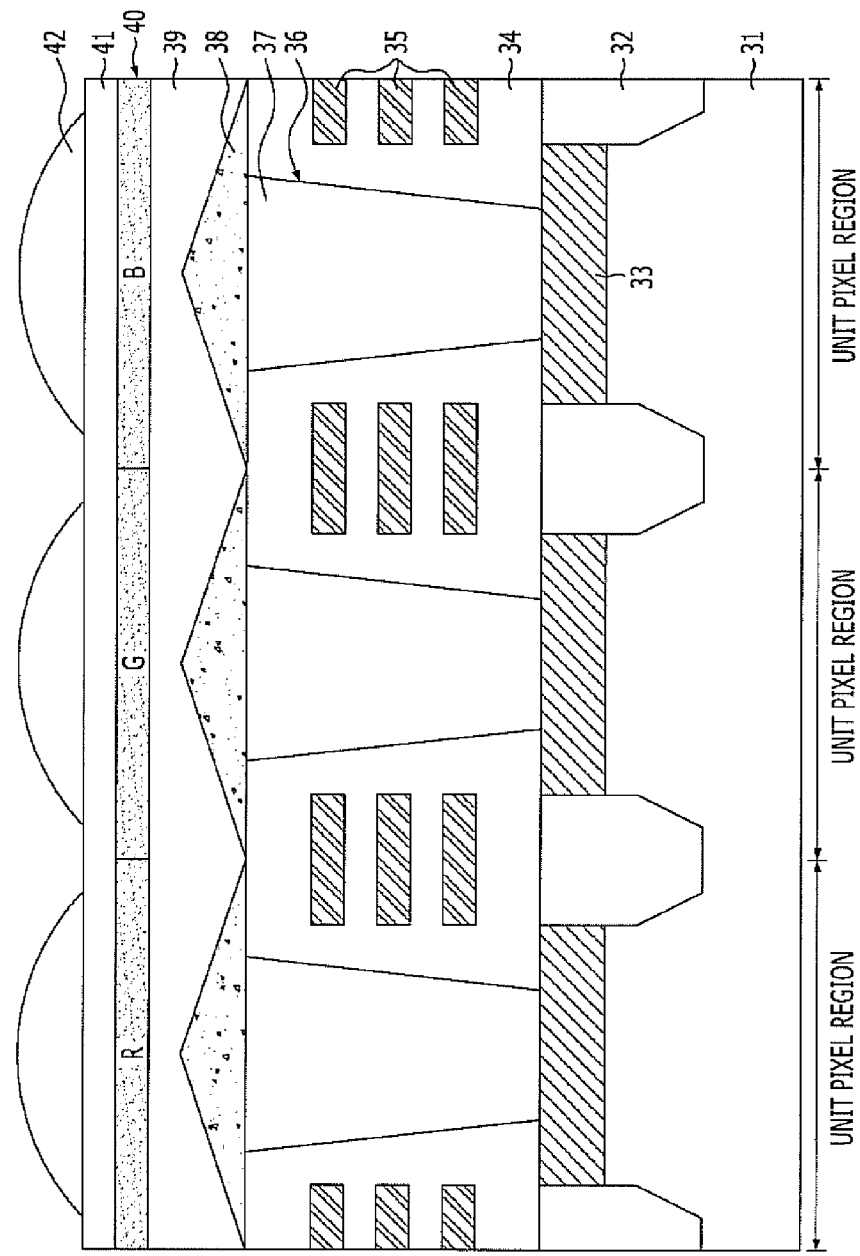

IMAGE SENSOR AND METHOD FOR FABRICATING THE SAME

CROSS-REFERENCE TO RELATED APPLICATIONS

The present application claims priority of Korean Patent Application No. 10-2011-0039697, filed on Apr. 27, 2011, which is incorporated herein by reference in its entirety.

BACKGROUND

1. Field

Exemplary embodiments of the present invention relate to a technology for fabricating a semiconductor device, and more particularly, to an image sensor including a lightguide and a method for fabricating the same.

2. Description of the Related Art

An image sensor is a device for converting an optical image into an electrical signal. As design rules of devices shrinks, the unit pixel size of image sensors also decreases and causes a decrease in sensitivity of image sensors. Here, such a decrease in sensitivity may increase a signal-to-noise ratio (SNR) and thus degrade the quality of an image acquired through image sensors.

To address such features, a front-side-illumination (FSI) image sensor may use a lightguide. Hereafter, referring to FIG. 1, an image sensor including a lightguide will be described.

FIG. 1 is a cross-sectional view of a conventional image sensor.

Referring to FIG. 1, the conventional image sensor includes a substrate 11 having a plurality of unit pixel regions and a plurality of light receiving elements 13 formed in respective unit pixel regions. The respective light receiving elements 13 are isolated by an isolation layer 12. An interlayer dielectric layer 14 including multilayer metal interconnections 16 is formed on the substrate 11. The interlayer dielectric layer 14 includes a lightguide 15 formed for respective light emitting elements 13. A color filter 17 having an RGB structure is formed on the interlayer dielectric layer 14 so as to cover the unit pixel regions, and a planarization layer 18 is formed on the color filter 17. On the planarization layer 18, a hemispheric lens 19 is formed for respective light receiving elements 13.

In the conventional image sensor, the opening area of the lightguide 15 is limited by the metal interconnections 16 formed in the interlayer dielectric layer 14. Therefore, the conventional image sensor has physical limits in focusing light.

Furthermore, in order to secure an incident angle which satisfies a total reflection condition of light incident on the lightguide 15, adjacent hemispheric lenses 19 are formed to be spaced apart from each other. However, since there are physical limits in securing an incident angle to satisfy the total reflection condition, it is difficult to obtain appropriate margins for the lens 19. Furthermore, light incident between adjacent lens 19 may not reach the light receiving element 13 and be lost.

Meanwhile, when uniform properties are not secured at the edges of each unit pixel region even when adjacent lenses 19 are formed to contact each other, there are physical limits in focusing light incident obliquely with respect to the lens 19 to a target unit pixel region. Thus, optical shading effects may be distorted.

In order to obtain lens 19 which satisfies the light focusing ability and the total reflection condition despite the limited opening area of the lightguide 15, the lightguide 15 is formed of a high refractive index material. In this case, production costs of image sensors may increase.

SUMMARY

An embodiment of the present invention is directed to an image sensor capable of improving a light focusing ability of a lightguide and a method for fabricating the same.

Another embodiment of the present invention is directed to an image sensor capable of securing a lens design margin and a method for fabricating the same.

Another embodiment of the present invention is directed to an image sensor capable of reducing production costs and a method for fabricating the same.

In accordance with an embodiment of the present invention, an image sensor includes: a substrate having a unit pixel region; a light receiving element formed in the substrate of each unit pixel region; an interlayer dielectric layer formed over the substrate; a lightguide formed in the interlayer dielectric layer for the light receiving element; a light focusing pattern formed over the interlayer dielectric layer at the pixel region; a planarization layer formed over the substrate and covering the light focusing pattern; and a lens formed over the planarization layer at the pixel region.

In accordance with yet another embodiment of the present invention, a method for fabricating an image sensor includes: forming a plurality of light receiving elements in the substrate at a plurality of unit pixel regions, respectively; forming an interlayer dielectric layer over the substrate; forming a plurality of lightguides through the interlayer dielectric layer for the plurality of light receiving elements, respectively; forming a plurality of light focusing patterns over the interlayer dielectric layer at the plurality of unit pixel regions, respectively; forming a planarization layer over the entire upper surface of the substrate such that the planarization layer covers the plurality of light focusing patterns; and forming a plurality of lenses over the planarization layer at the plurality of unit pixel regions, respectively.

BRIEF DESCRIPTION OF THE DRAWINGS

FIG. 1 is a cross-sectional view of a conventional image sensor.

FIGS. 4A to 4D are cross-sectional views illustrating a method for fabricating an image sensor in accordance with another embodiment of the present invention.

DETAILED DESCRIPTION

Figure 2A:
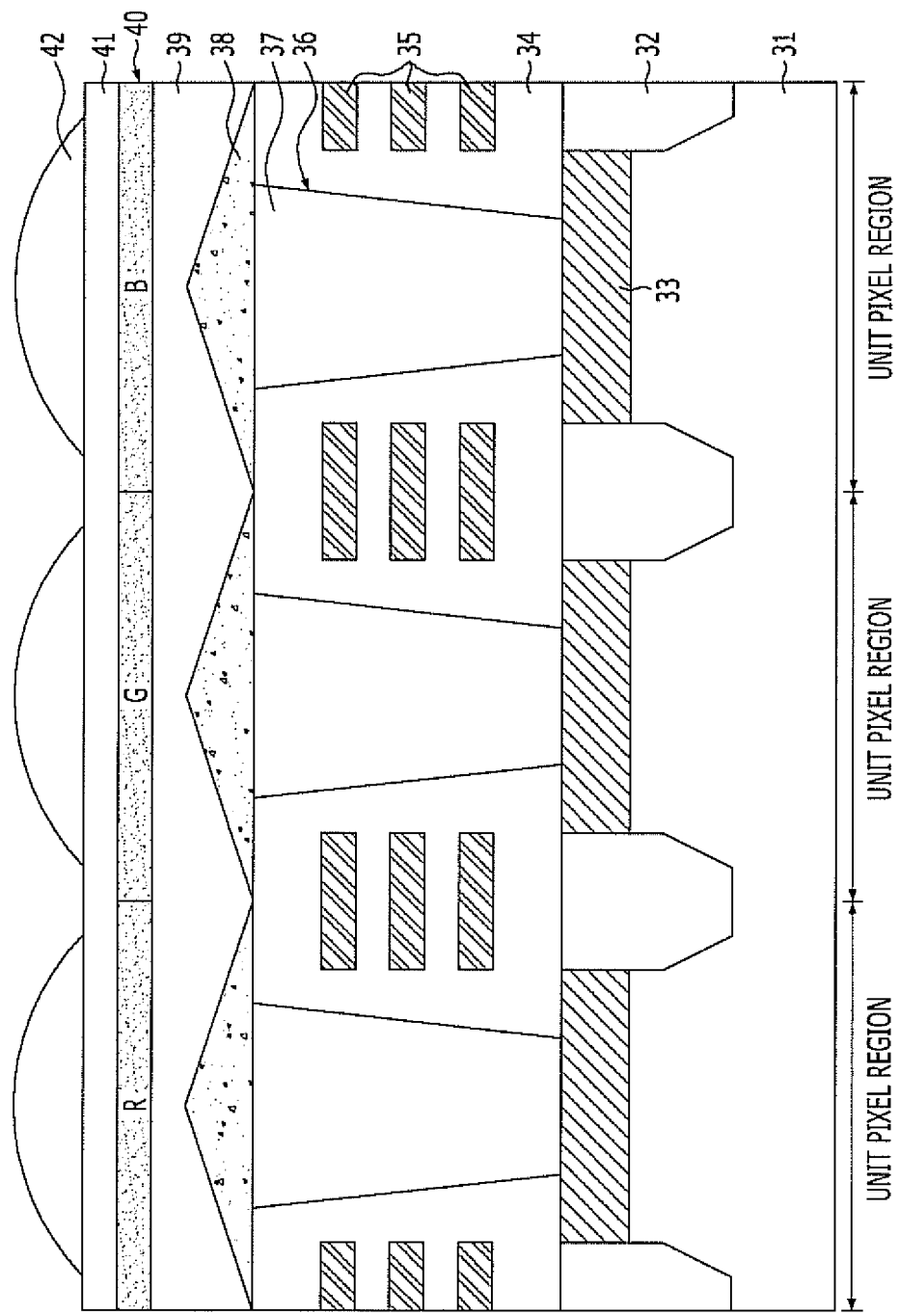
FIG. 2A is a cross-sectional view of an image sensor in accordance with an embodiment of the present invention.

Exemplary embodiments of the present invention will be described below in more detail with reference to the accompanying drawings. The present invention may, however, be embodied in different forms and should not be construed as limited to the exemplary embodiments set forth herein. Rather, these embodiments are provided so that this disclosure will be thorough and complete, and will fully convey the scope of the present invention to those skilled in the art.

Throughout the disclosure, like reference numerals refer to like parts throughout the various figures and embodiments of the present invention.

The drawings are not necessarily to scale and in some instances, proportions may have been exaggerated in order to clearly illustrate features of the exemplary embodiments. When a first layer is referred to as being "on" a second layer or "on" a substrate, it not only refers to a case where the first layer is formed directly on the second layer or the substrate but also a case where a third layer exists between the first layer and the second layer or the substrate.

The exemplary embodiments of the present invention provide an image sensor including a lightguide, which is capable of improving a light focusing ability of the lightguide, securing a lens design margin, and reducing a production cost, and a method for fabricating the same. The image sensor in accordance with the exemplary embodiment of the present invention is characterized in that a light focusing pattern capable of controlling an incident angle of light incident on the lightguide is inserted between a lens and the lightguide. When the light focusing pattern is inserted between the lens and the lightguide, the sensitivity and angular response of an FSI image sensor may be improved, an optical crosstalk may be minimized, and the production costs may be decreased.

Figure 2B:
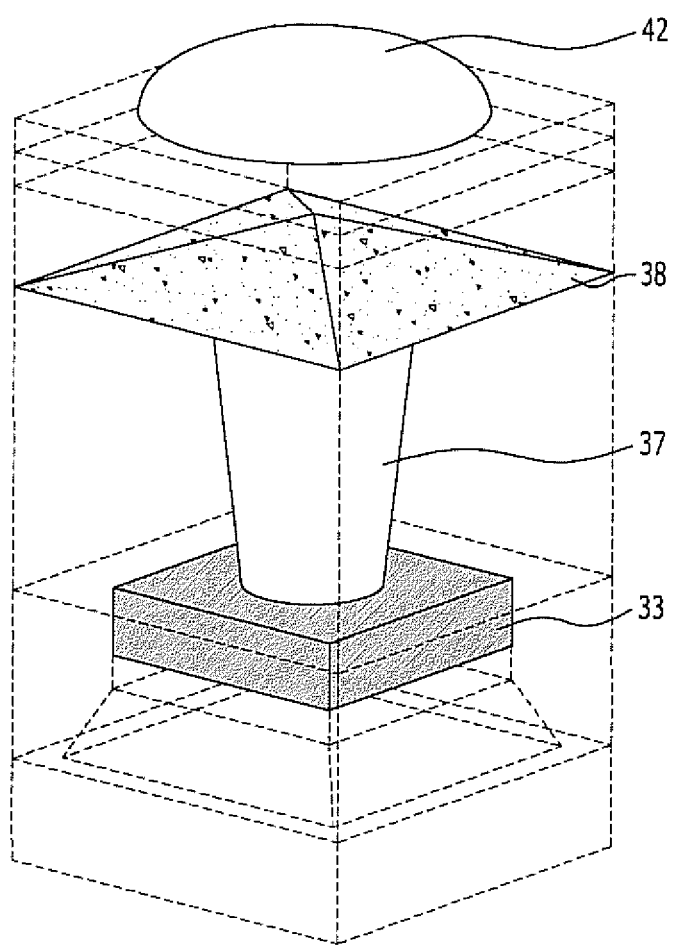
FIG. 2B is a perspective view of a unit pixel of the image sensor in accordance with the exemplary embodiment of the present invention.

FIG. 2A is a cross-sectional view of an image sensor in accordance with an embodiment of the present invention. FIG. 2B is a perspective view of a unit pixel of the image sensor in accordance with the exemplary embodiment of the present invention.

Referring to FIGS. 2A and 2B, the image sensor in accordance with the exemplary embodiment of the present invention includes a substrate 31 having a plurality of unit pixel regions, a light receiving element 33 formed in the substrate 31 of each unit pixel region, an isolation layer 32, an interlayer dielectric layer 34, a lightguide 37, a light focusing pattern 38, a first planarization layer 39, a color filter 40, a second planarization layer 41, and a hemispherical lens 42. The isolation layer 32 is formed in the substrate 31 so as to isolate adjacent light receiving elements 33. The interlayer dielectric layer 34 is formed on the substrate 31 and includes multilayer metal interconnections 35. The lightguide 37 is formed in the interlayer dielectric layer 34 in correspondence to the light emitting element 33. The light focusing pattern 38 is formed on the interlayer dielectric layer 34 in correspondence to the unit pixel region. The first planarization layer 39 is formed on the entire surface of the substrate 31 so as to cover the light focusing pattern 38. The color filter 40 is formed on the first planarization layer 39. The second planarization layer 41 is formed on the color filter 40. The hemispherical lens 42 are formed on the second planarization layer 41 for respective unit pixel regions.

The light receiving element 33 formed in the substrate 31 of each unit pixel region includes a photodiode, and the photodiode 33 serves to generate photogenerated charges by using light received through the lightguide 37.

The metal interconnections 35 formed in the interlayer dielectric layer 34 may have such a structure that is disposed over the isolation layer 32 to secure, for example, the largest possible opening of the light receiving element 33. The interlayer dielectric layer 34 may include any one selected from the group consisting of oxide, nitride, and oxynitride.

The lightguide 37 formed in the interlayer dielectric layer 34 for the light receiving element 33 has a structure in which a material having a refractive index larger than the interlayer dielectric layer 34 is buried in a trench 36 which is formed in the interlayer dielectric layer 34 and exposes the light receiving element 33. For example, when the interlayer dielectric layer 34 has a refractive index of 1.4 to 1.5, the lightguide 37 may include a material having a refractive index of 1.6 to 1.7.

The light focusing pattern 38 formed on the interlayer dielectric layer 34 in each unit pixel region may be formed of a material having a larger refractive index than the lightguide 37, in order to satisfy a total reflection condition of light incident on the lightguide 38 (that is, to control an incident angle of light incident through the lens 42). For example, when the lightguide 37 has a refractive index of 1.6 to 1.7, the light focusing pattern 38 may include a material having a refractive index of 1.8 to 2.1. In this case, the light focusing pattern 38 may be formed of nitride.

The light focusing pattern 38 may have an area equal to that of the entire unit pixel region, that is, one light focusing pattern 38 may cover the entire area of one unit pixel region. Therefore, an edge of the light focusing pattern 38 is in contact with an edge of an adjacent light focusing pattern 38. Such a structure may cause all of light incident on the unit pixel region to be incident on the lightguide 37, thereby improving a light focusing ability. Simultaneously, the structure substantially prevents light incident between the lenses 42 from being lost.

The light focusing pattern 38 may be formed in a conical shape, and the conical shape may be adjusted depending on the plane shape of the unit pixel region. For example, when the plane shape of the unit pixel region is a rectangle, the light focusing pattern 38 may be formed in a pyramid shape (refer to FIG. 2B), and when the plane shape of the unit pixel region is a circle, the light focusing pattern 38 may be formed in a conical shape.

The first planarization layer 39 covering the light focusing pattern 38 serves to eliminate a layer level difference caused by the light focusing pattern 38, and the second planarization layer 41 formed on the color filter 40 serves to eliminate a layer level difference caused by the color filter 40. The first and second planarization layers 39 and 41 may include any one selected from the group consisting of oxide, nitride, and oxynitride, and may be formed of the same material as the interlayer dielectric layer 34. The color filter 40 may have an RGB structure for acquiring a color image.

The lens 42 formed on the second planarization layer 41 each has a structure that is spaced apart from an adjacent lens 42 in order to improve optical shading properties.

In the image sensor in accordance with the exemplary embodiment of the present invention, the light focusing pattern 38 is inserted between the lens 42 and the lightguide 37. Therefore, the light focusing ability of the lightguide 37 may be improved, and margins in the lens 42 may be increased. Furthermore, since a high refractive index material is not necessary, production costs may be reduced.

Figure 3:
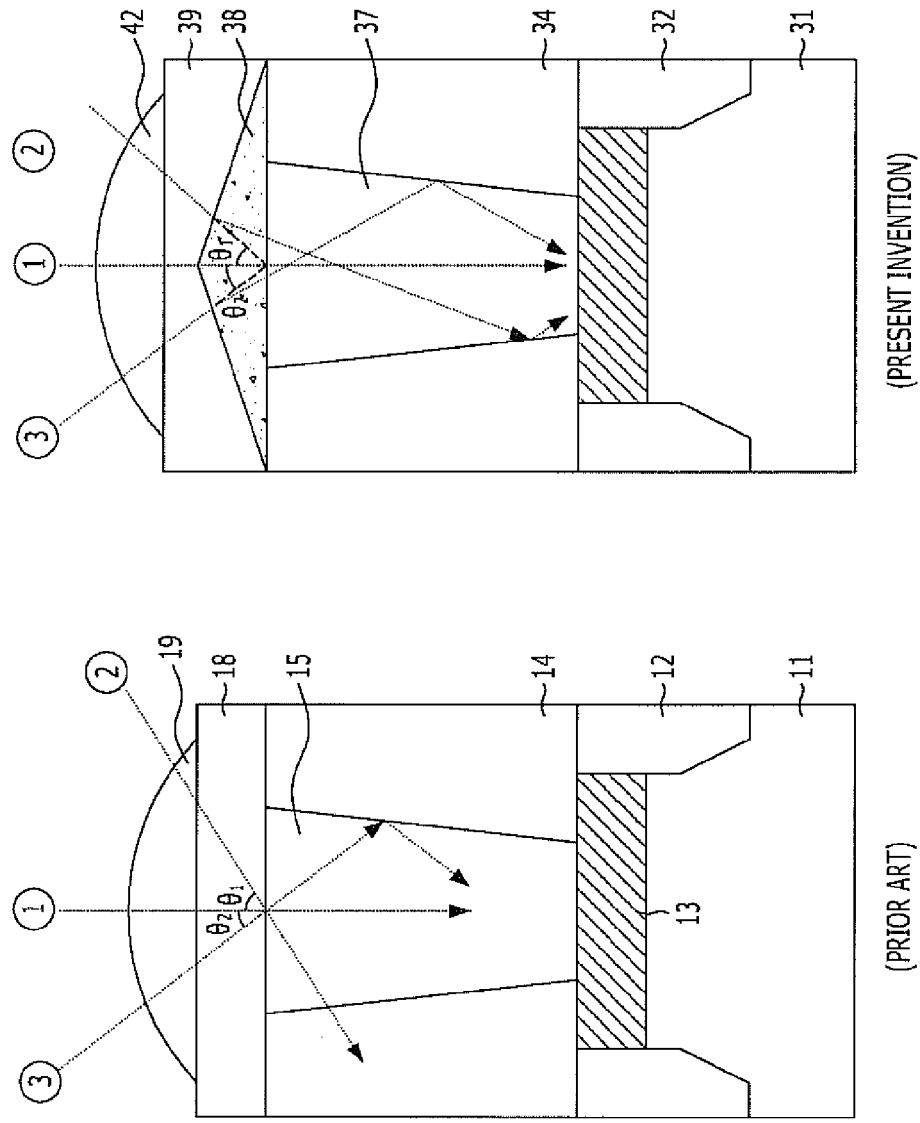
FIG. 3 illustrates a comparison of the conventional image sensor and the image sensor in accordance with the exemplary embodiment of the present invention.

FIG. 3 illustrates a comparison of the conventional image sensor and the image sensor in accordance with the exemplary embodiment of the present invention. Hereafter, referring to FIG. 3, the effect of the image sensor in accordance with the exemplary embodiment of the present invention will be described in detail. In FIG. 3, the conventional image sensor is illustrated by using the same reference characters of FIG. 1, and the image sensor in accordance with the exemplary embodiment of the present invention is illustrated by using the same reference characters of FIGS. 2A and 2B. In FIG. 3, ① indicates light which is incident vertically, ② indicates light having a larger incident angle than a maximum incident angle which satisfies the total reflection condition, and ③ indicates light having a smaller incident angle than the maximum incident angle which satisfies the total reflection condition.

The conventional image sensor satisfies a guiding condition when light focused through the lens 19 is incident on the lightguide 15 at an angle which satisfies the total reflection condition. In order to improve the light focusing ability of the lightguide 15 under a condition where light is obliquely incident on the lightguide 15, the lens 19 is designed so that the focusing point of the lens 19 is upwardly adjusted. However, as the focusing point of the lens 19 is upwardly adjusted, an incident angle of light incident on the opening surface of the lightguide may be increased. Therefore, since an optical loss occurs in the conventional image sensor, the refractive index of the lightguide 15 is to be upwardly adjusted to minimize the optical loss. Furthermore, light incident between the lenses 19 is not focused through the lightguide 15. Thus, further optical loss occurs.

On the other hand, the image sensor in accordance with the exemplary embodiment of the present invention includes the light focusing pattern 38 formed on the lightguide 37. Therefore, since light incident between the lenses 42 as well as light incident through the lens 42 is incident on the lightguide 37 by using the light focusing pattern 38, an optical fill factor may be increased. Thus, the light focusing ability of the lightguide 37 may be increased. Furthermore, since the light focusing pattern 37 may downwardly adjust an incident angle of light incident obliquely with respect to the lightguide 37, a margin of the lightguide 37 in guiding light may be adequately obtained. Furthermore, as the light focusing ability of the lightguide 37 is improved and the light guiding condition margin is secured, the focusing point of the lens 42 may be downwardly adjusted. Therefore, the light guiding condition margin of the lightguide 37 may be further improved.

Even if a typical material such as a titanium oxide or the planarization layer instead of a high refractive index material is used as a material forming the lightguide 37, the light guiding condition of the lightguide 37 may be used to secure proper margins. Accordingly, production costs of image sensors may be reduced.

FIGS. 4A to 4D are cross-sectional views illustrating a method for fabricating an image sensor in accordance with another embodiment of the present invention.

Figure 4A:
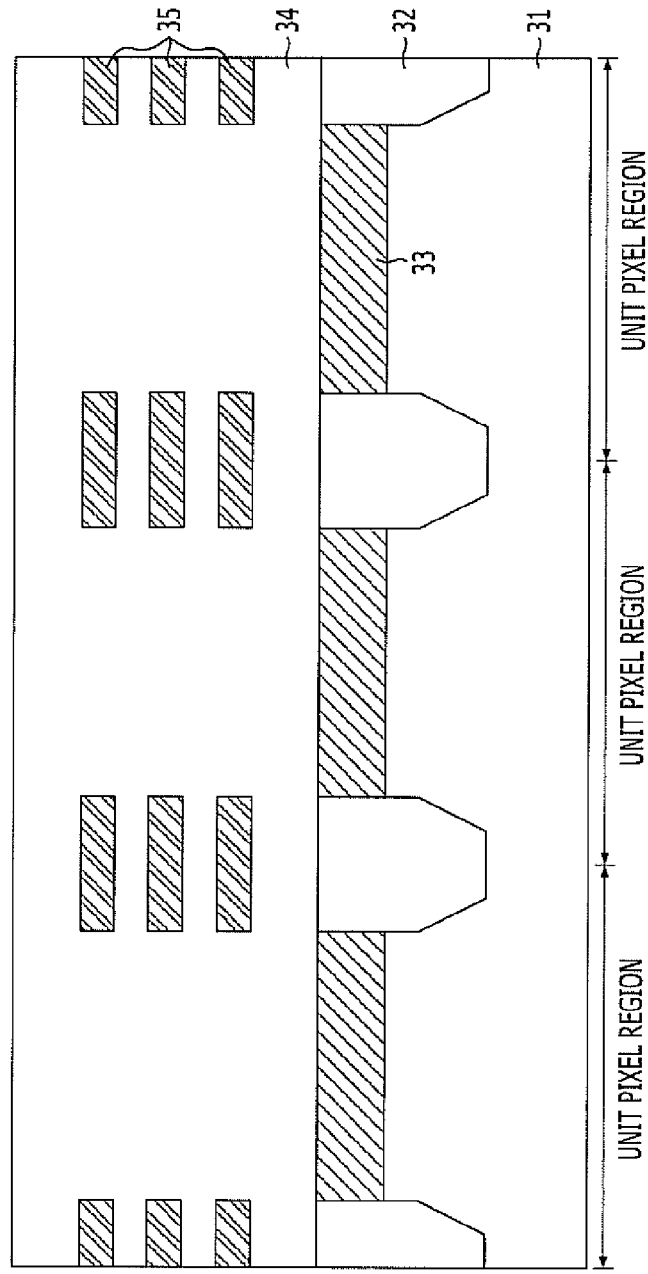

Referring to FIG. 4A, an isolation layer 32 and a plurality of light receiving element are formed in a substrate 31 having a plurality of unit pixel regions. The isolation layer 32 serves to isolate adjacent light receiving elements 33 from each other. The light receiving element 33 may include a photodiode and is formed in each unit pixel region. The isolation layer 32 may be formed by a shallow trench isolation (STI) process.

An interlayer dielectric layer 34 including multilayer metal interconnections 35 is formed on the substrate 31. The interlayer dielectric layer 34 may be formed of any one selected from the group consisting of oxide, nitride, and oxynitride. The metal interconnections 35 are formed over the isolation layer 32 in order to secure, for example, the largest possible opening area of the light receiving element.

Figure 4B:
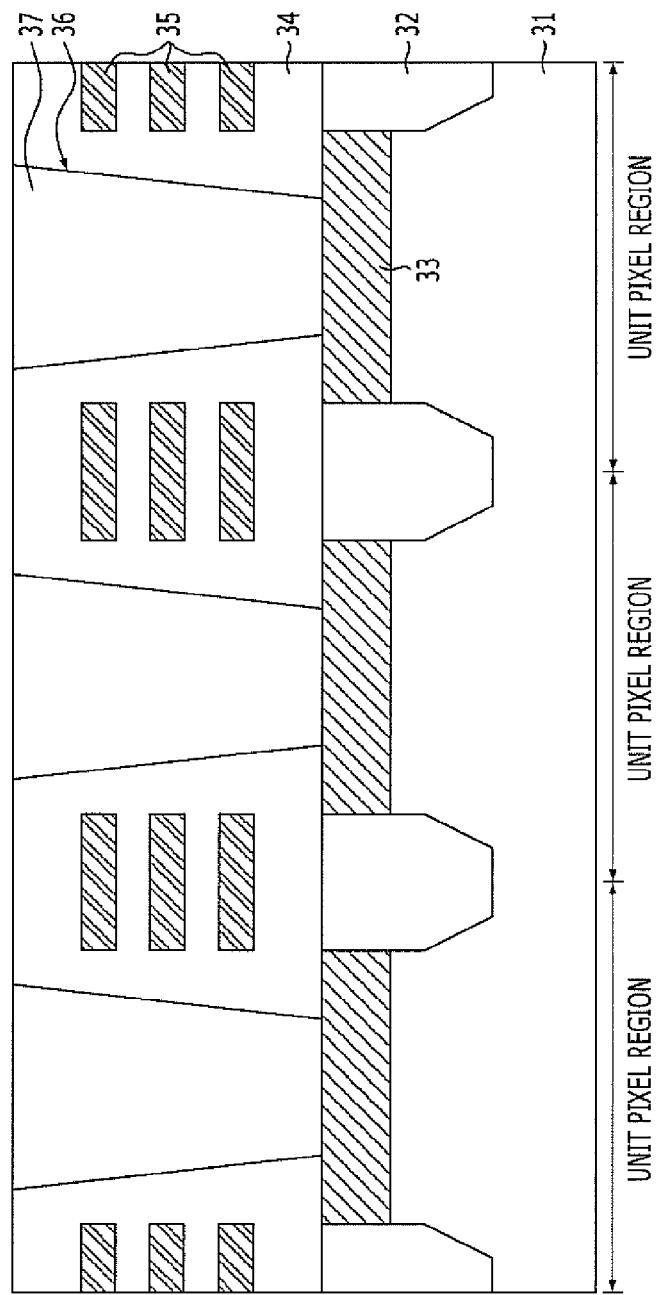

Referring to FIG. 4B, the interlayer dielectric layer 34 is selectively etched to form a trench 36 exposing the light receiving element 33 of each unit pixel region. The trench 36 may be formed by using a dry etching method.

The trench 36 is gap-filled with a material having a larger refractive index than the interlayer dielectric layer 34 to form a lightguide 37. For example, when the interlayer dielectric layer 34 has a refractive index of 1.4 to 1.5, the lightguide 37 may be formed of a material having a refractive index of 1.6 to 1.7.

Figure 4C:
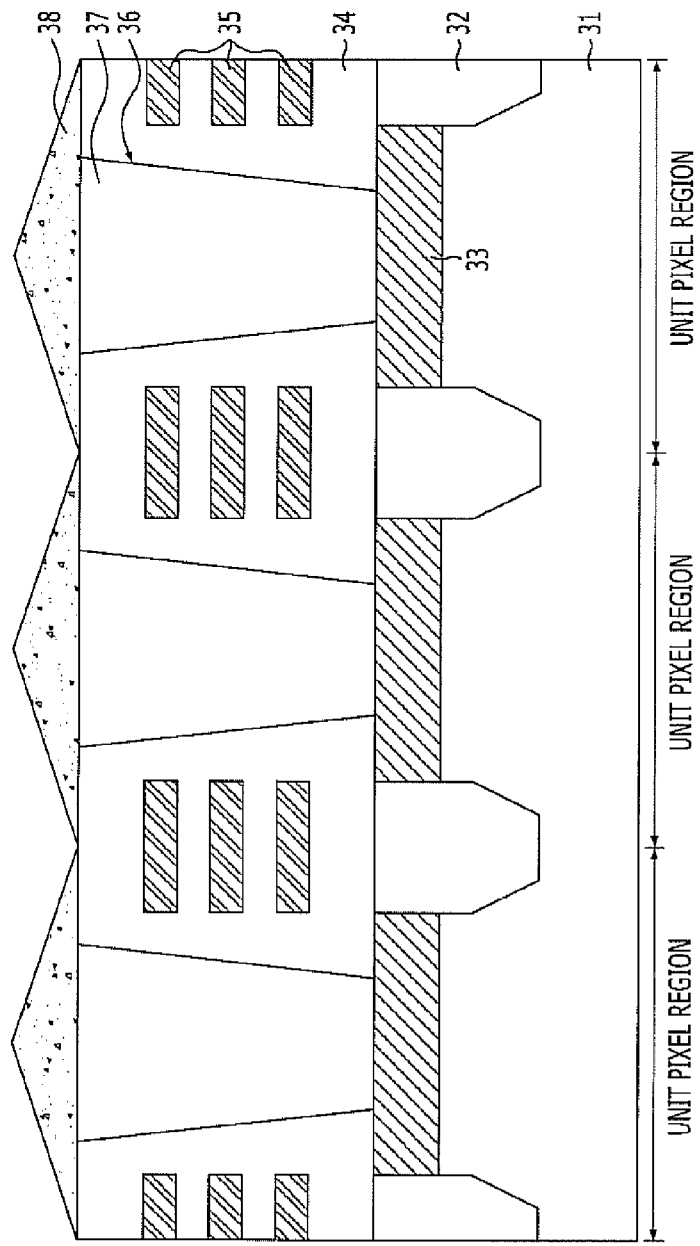

Referring to FIG. 4C, a light focusing pattern 38 is formed on the interlayer dielectric layer 34 having the lightguide 37 formed therein so as to correspond to the unit pixel region. At this time, the light focusing pattern 38 may be formed of a material having a larger refractive index than the lightguide 37 in order to satisfy the total reflection condition of light incident on the lightguide 37. For example, when the refractive index of the lightguide 37 ranges from 1.6 to 1.7, the light focusing pattern 38 may be formed of a material having a refractive index of 1.8 to 2.1. In this case, the light focusing pattern 38 may be formed of nitride.

The light focusing pattern 38 may be formed to have the same area as that of the entire unit pixel region. That is, the light focusing pattern 38 may be formed to cover the entire are of the unit pixel region. Therefore, the light focusing pattern 38 has a structure in which an edge thereof is in contact with an edge of an adjacent light focusing pattern 38. Such a structure may cause all of light incident on the unit pixel region to be incident on the lightguide 37, thereby improving a light focusing ability. Simultaneously, the structure substantially prevents light incident between the lenses 42 from being lost.

The light focusing pattern 38 may be formed in a conical shape, and the conical shape may be adjusted depending on the plane shape of the unit pixel region. For example, when the plane shape of the unit pixel region is a rectangle, the light focusing pattern 38 may be formed in a pyramid shape, and when the plane shape of the unit pixel region is a circle, the light focusing pattern 38 may be formed in a conical shape.

Referring to FIG. 4D, a first planarization layer 39 is formed on the entire surface of the substrate 31 including the light focusing pattern 38. The first planarization layer 39 serves to eliminate a layer level difference caused by the light focusing pattern 38. The first planarization layer 39 may include any one selected from the group consisting of oxide, nitride, and oxynitride, and may be formed of the same material as the interlayer dielectric layer 34.

A color filter 40 is formed on the first planarization layer 39, and a second planarization layer 41 is formed on the color filter 40. The color filter 40 may be formed in an RGB type. The second planarization layer 41 may include any one selected from the group consisting of oxide, nitride, and oxynitride, and may be formed of the same material as the first planarization layer 34.

A hemispheric lens 42 is formed on the second planarization layer 41 in correspondence to each unit pixel region. At this time, the lens 42 is formed to be spaced apart from an adjacent lens, in order to secure optical shading properties.

In the image sensor formed through the fabrication process in accordance with the exemplary embodiment of the present invention, the light focusing pattern 38 is formed between the lens 42 and the lightguide 37. Therefore, the light focusing ability of the lightguide 37 may be improved, and the design margin of the lens 42 may be increased. Furthermore, since a high refractive index material is not necessary, production costs may be reduced.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
   a substrate having a pixel region;
   a light receiving element formed in the substrate at the unit pixel region;
   an interlayer dielectric layer formed over the substrate;
   a lightguide formed in the interlayer dielectric layer for the light receiving element;

a light focusing pattern formed over the interlayer dielectric layer at the pixel region;

a planarization layer formed over the substrate and covering the light focusing pattern; and a lens formed over the planarization layer at the pixel region, wherein the light focusing pattern is formed in a conical shape or a pyramid shape, and is formed of a material having a larger refractive index than the lightguide in order to refract a light to satisfy a total reflection condition of light incident on the lightguide.

2. The image sensor of claim 1, wherein the light focusing pattern has a different refractive index from that of the lightguide.

3. The image sensor of claim 2, wherein the light focusing pattern has a larger refractive index than the lightguide.

4. The image sensor of claim 1, wherein the image sensor has a plurality of pixel regions that are each formed of the light receiving element, interlayer dielectric layer, lightguide, light focusing pattern, planarization layer, lens, and the light focusing pattern of one of the pixel regions contacts the light patterns of adjacent ones of the pixel regions.

5. A method for fabricating an image sensor, comprising:
forming a plurality of light receiving elements in the substrate at a plurality of unit pixel regions, respectively;
forming an interlayer dielectric layer over the substrate;
forming a plurality of lightguides through the interlayer dielectric layer for the plurality of light receiving elements, respectively;
forming a plurality of light focusing patterns over the interlayer dielectric layer at the plurality of unit pixel regions, respectively;
forming a planarization layer over the entire upper surface of the substrate such that the planarization layer covers the plurality of light focusing patterns; and
forming a plurality of lenses over the planarization layer at the plurality of unit pixel regions, respectively,
wherein an edge of each of the plurality of light focusing patterns is in contact with an edge of an adjacent light focusing pattern of the plurality of light focusing patterns, and wherein each of the light focusing patterns is formed of a material having a larger refractive index than the lightguide in order to refract a light to satisfy a total reflection condition of light incident on the lightguide.

6. The method of claim 5, wherein the light focusing pattern is formed of a material having a different refractive index from that of the lightguide.

7. The method of claim 6, wherein the plurality of light focusing pattern are each formed of a material having a larger refractive index than the respective lightguide.

8. The method of claim 5, wherein the plurality of light focusing patterns are each formed in a conical shape and each contact the light focusing patterns of neighboring unit pixel regions.

9. An image sensor comprising:
a substrate having a plurality of pixel regions;
a plurality of light receiving elements formed in the substrate at the plurality of pixel regions;
an interlayer dielectric layer formed over the substrate;
a plurality of lightguides formed in the interlayer dielectric layer for the plurality of light receiving elements;
a plurality of light focusing patterns formed over the interlayer dielectric layer at the plurality of pixel regions;
a planarization layer formed over the substrate and covering the plurality of light focusing patterns; and
a plurality of lens formed over the planarization layer at the plurality of pixel regions,
wherein an edge of each of the plurality of light focusing patterns is in contact with an edge of an adjacent light focusing pattern of the plurality of light focusing patterns, and
wherein each of the light focusing patterns is formed of a material having a larger refractive index than the lightguide in order to refract a light to satisfy a total reflection condition of light incident on the lightguide.

10. The image sensor of claim 9, wherein each of the plurality of light focusing patterns is formed in a conical shape when a plane shape of each of the plurality of pixel regions is a rectangle, or each of the plurality of light focusing patterns is formed in a pyramid shape when the plane shape of each of the plurality of pixel regions is a circle.

* * * * *